United States Patent
Navarro et al.

(10) Patent No.: US 11,711,927 B2
(45) Date of Patent: Jul. 25, 2023

(54) FILAMENTARY TYPE NON-VOLATILE MEMORY DEVICE

(71) Applicants: Commissariat à l'Energie Atomique et aux Energies Alternatives, Paris (FR); UNIVERSITE GRENOBLE ALPES, Saint-Martin d'Heres (FR); CENTRE NATIONAL DE LA RECHERCHE SCIENTIFIQUE, Paris (FR)

(72) Inventors: Gabriele Navarro, Grenoble (FR); Nicolas Guillaume, Grenoble (FR); Serge Blonkowski, Meylan (FR); Patrice Gonon, Saint Egrève (FR); Eric Jalaguier, Grenoble (FR)

(73) Assignees: COMMISSARIAT A L'ENERGIE ATOMIQUE ET AUX ENERGIES ALTERNATIVES, Paris (FR); UNIVERSITE GRENOBLE ALPES, Saint-Martin d'Heres (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 280 days.

(21) Appl. No.: 17/006,041

(22) Filed: Aug. 28, 2020

(65) Prior Publication Data
US 2021/0066395 A1    Mar. 4, 2021

(30) Foreign Application Priority Data

Aug. 30, 2019   (FR) ...................................... 1909570

(51) Int. Cl.
*H01L 45/00*    (2006.01)
*H10B 63/00*    (2023.01)
*H10N 70/00*    (2023.01)

(52) U.S. Cl.
CPC ........... *H10B 63/82* (2023.02); *H10N 70/021* (2023.02); *H10N 70/8265* (2023.02); *H10N 70/841* (2023.02); *H10N 70/883* (2023.02)

(58) Field of Classification Search
CPC .............................. H01L 45/124; H01L 45/16
See application file for complete search history.

(56) References Cited

U.S. PATENT DOCUMENTS

2005/0127524 A1* 6/2005 Sakamoto ............. H01L 45/144
                                                       257/E27.071
2005/0243596 A1   11/2005 Symanczyk
(Continued)

OTHER PUBLICATIONS

Search Report as issued in French Patent Application No. 1909570, dated Apr. 17, 2020.
(Continued)

*Primary Examiner* — Mark V Prenty
(74) *Attorney, Agent, or Firm* — Pillsbury Winthrop Shaw Pittman LLP (57) ABSTRACT

A filament type non-volatile memory device, includes a first electrode, a second electrode and an active layer extending between the first electrode and the second electrode, the active layer electrically interconnecting the first electrode to the second electrode, the device being suitable for having: a low resistive state, in which a conducting filament electrically interconnecting the first electrode to the second electrode uninterruptedly extends from end to end through the active layer, the filament having a low electric resistance, and a highly resistive state, in which the filament is broken, the filament having a high electric resistance. The device further includes a shunt resistance electrically connected in parallel to the active layer, between the first electrode and the second electrode.

19 Claims, 4 Drawing Sheets

(56) References Cited

U.S. PATENT DOCUMENTS

2011/0103131 A1  5/2011  Katayama et al.
2011/0248381 A1  10/2011 Tong et al.
2014/0029327 A1  1/2014  Strachan et al.

OTHER PUBLICATIONS

Sassine, G., et al., "Sub-pJ Consumption and Short Latency Time in RRAM Arrays for High Endurance Applications," 2018 IEEE International Reliability Physics Symposium (IRPS), (2018), 5 pages.

* cited by examiner

FILAMENTARY TYPE NON-VOLATILE MEMORY DEVICE

CROSS-REFERENCE TO RELATED APPLICATIONS

This application claims priority to French Patent Application No. 1909570, filed Aug. 30, 2019, the entire content of which is incorporated herein by reference in its entirety.

TECHNICAL FIELD

The technical field is, generally speaking, that of microelectronics, more precisely that of filament-type non-volatile memory devices.

TECHNOLOGICAL BACKGROUND

New types of non-volatile memories, called resistive memories, or sometimes ReRAM (Resistive Random Access Memory), have been developed in past few years. As for any non-volatile memory, logic information recorded in the memory remains stored therein, without being erased, when the memory is turned off. In a resistive memory, this binary logic information, is represented by either high or low resistance levels, of different resistive cells contained in the memory.

Figure 1:
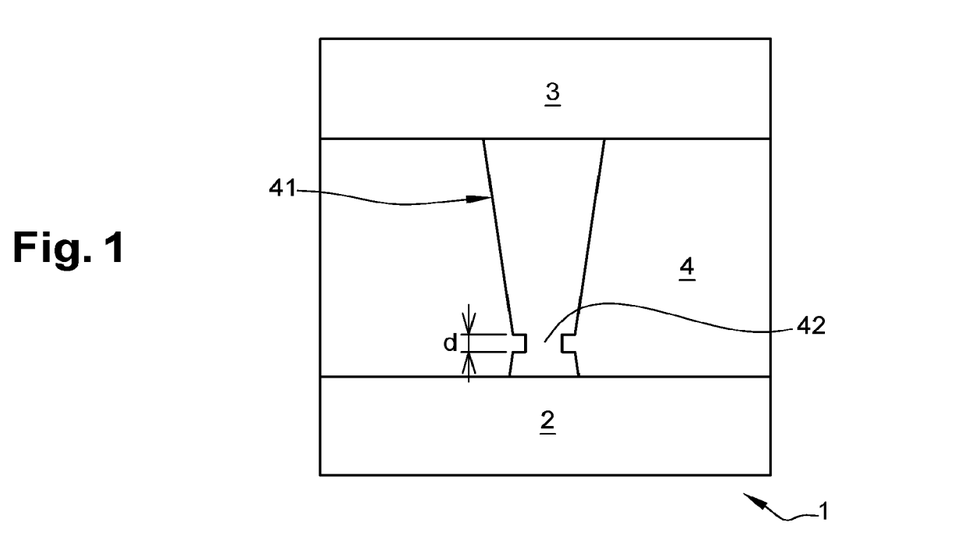
FIG. 1 schematically represents a filament type memory cell, more precisely of the OxRam type, in a cross-section view.

A filament type resistive cell more precisely comprises an active layer 4 interleaved (sandwiched) between two conducting electrodes 2 and 3 (see FIG. 1, which schematically represents such a memory cell, in a cross-section view). In the active layer 4, an electrically conducting filament 41 is either broken, or on the contrary formed again, to vary the resistance level of the memory cell, during cycles of writing and then resetting this cell (SET operations, when the filament is reformed, and RESET operations, when the filament is broken again). The active layer 4 is essentially insulating, except at the filament in question.

In an oxide, filament-type memory, sometimes called OxRam (Oxide Random Access Memory), the active layer 4 is more precisely formed of a metal oxide, for example a tantalum or hafnium oxide. And in an ionic conducting filament type memory, sometimes called CB-RAM (Conductive Bridge Random Access Memory), generally, the active layer 4 consists of a solid electrolyte in which metal cations can be relocated and reduced to form the conducting filament.

Manufacturing a filament memory comprises a so-called "forming" step, during which the filament is formed for the first time in the active layer, initially free of filament. To this end, an electric voltage is applied between the first and second electrodes of the memory cell 1 considered. The value of this voltage is increased until the conducting filament 41 is formed in the active layer 4. In some cases, the "forming" step is rather performed by injecting a controlled electric current into one of the electrodes of the memory cell, the value of this current being gradually increased until the conducting filament is formed. More generally, the "forming" step is achieved by driving the voltage and/or current applied to the memory cell, according to a predetermined driving cycle.

After this "forming" step, the memory cell 1 is ready for use. The conducting filament 41 can then be broken, and then formed again, and then broken again and so on. To break the filament 41, or to form it again, the electric voltage applied between the electrodes and/or the electric current injected into one of these electrodes are varied, according to a predetermined cycle.

In the low resistive state of the memory cell 1, the conducting filament, which uninterruptedly extends from end to end through the active layer, has a low electric resistance, $R_L$. And in the highly resistive state of the memory cell 1, the filament is broken, so that the memory cell has a high electric resistance, $R_H$.

Figure 2:
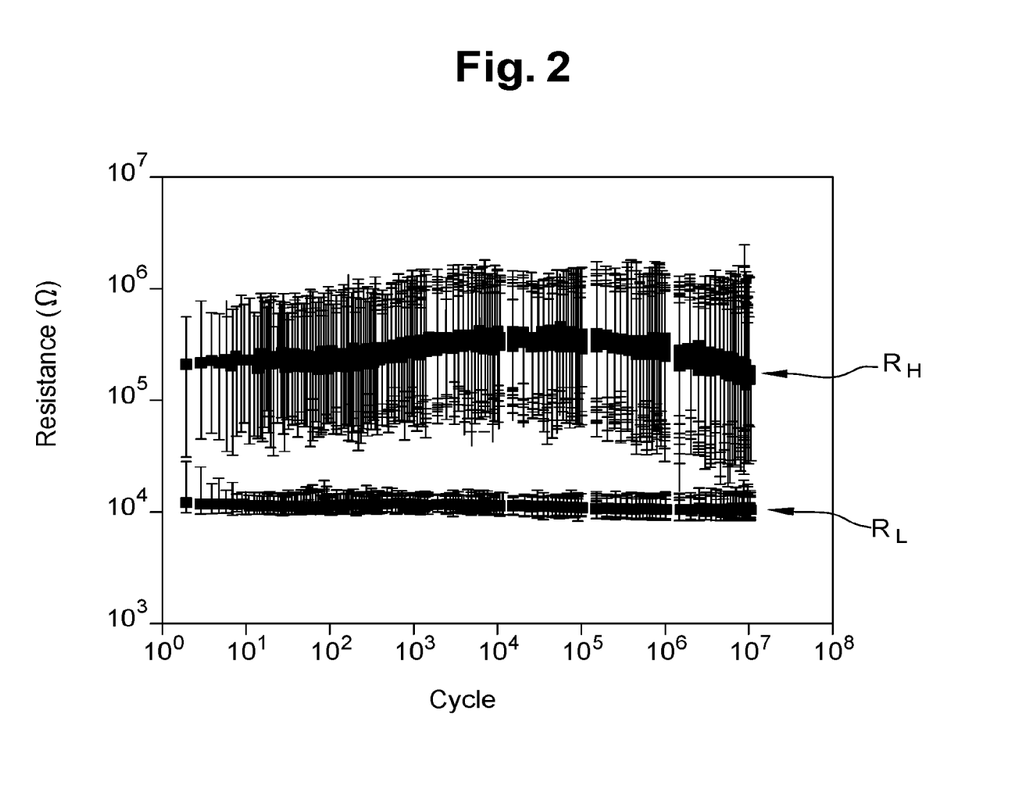
FIG. 2 shows median values of the low resistances $R_L$ and high resistances $R_H$ of a conducting filament of 200 memory cells of FIG. 1, obtained during 10 million successive writing and resetting cycles of the memory cells.

FIG. 2 represents median values of the low and high resistances of the filament, RL and RH, obtained during 10 million successive cycles of writing and then resetting 200 OxRAM type memory cells (from the publication Gilbert Sassine et al., "Sub-pJ consumption and short latency time in RRAM arrays for high endurance applications", 2018 IEEE International Reliability Physics Symposium (IRPS), DOI: 10.1109/IRPS.2018.8353675). As can be seen in this figure, the value of the high resistance RH of the filament strongly varies from one cycle to the other, the corresponding relative variation being nearly 100%.

Upon reading the memory, detecting the state, either low resistive, or highly resistive of the cell is made difficult by these significant fluctuations of the high resistance $R_H$ of the filament, from one cycle of resetting of the memory to the other. These resistance variations therefore complicate the reading operation of the memory and can make it less reliable. Upon reading of the memory, variability of the resistance of the device can impact the reading rate and therefore also generate reading errors. Moreover, having a strong variability of the highly resistive state, can result in a variability in the SET operation (switching from the highly resistive state to the low resistive state) and in the final resistance after the SET operation.

In the case of an OxRam or CB-Ram type filament memory, a possible explanation for variations in the high resistance $R_H$ of the filament, from one resetting cycle to the other, is the following: when the filament is broken to switch the memory cell from its low resistive state to his highly resistive state (RESET step), only a portion 42 of the filament 41 is broken (see FIG. 1). It is this portion 42 which is subsequently reformed, to switch the memory cell into its low resistive state (and then destroyed again, and so on). In the highly resistive state of the memory cell, an electrically insulating zone, the thickness d of which is low, separates the lower and upper parts of the filament 41. Through this insulating zone, electric current flows by tunnel effect. The high resistance $R_H$ of the filament is therefore essentially equal to the "tunnel resistance" of this thin insulating zone, which exponentially varies with the thickness d of the insulating zone (it will be noted that FIG. 1 is highly schematic: the junction zone between the upper and lower parts of the filament has a thickness d which is in the order of the dimension of an atom; in this scale, the ends of the filament are therefore somewhat dented due to the presence of different atoms). But reforming and then destroying again the small filament portion 42 generally comes with a slight rearrangement of atoms relative to each other, at the junction between the upper and lower parts of the filament. This rearrangement causes a slight variation in the "effective" distance d, over which electric current flows by tunnel effect, and therefore a variation, this time significant, in the corresponding tunnel resistance.

Anyhow, it is desirable to avoid or to limit variations in the high electric resistance of the memory cell, from one resetting cycle to the other, to make the reading operation of this cell simpler, and to make information storing within it more reliable.

SUMMARY

In this context, a filament type non-volatile memory device is provided, comprising a first electrode, a second electrode and an active layer extending between the first electrode and the second electrode, the active layer electrically interconnecting the first electrode to the second electrode, the device being suitable for having:
- a low resistive state, in which a conducting filament electrically interconnecting the first electrode to the second electrode uninterruptedly extends from end to end through the active layer, said filament having a low electric resistance, and
- a highly resistive state, in which said filament is broken, said filament having a high electric resistance.

The device comprises a shunt resistance electrically connected in parallel to said active layer, between the first electrode and the second electrode, and, in this device:
- an electrically insulating, spacer layer, partially covers the first electrode, a cavity being provided in this spacer layer, said cavity having a bottom, consisting of a part of the first electrode which is not covered with the spacer layer, the cavity having at least one side face which, in the spacer layer, laterally delimits the cavity,
- the shunt resistance is at least partially formed of a resistive material layer applied against the side face of the cavity,
- the active layer of the device extends parallel to the bottom of the cavity and further extends by covering said layer of resistive material, and
- the second electrode partially covers the spacer layer and fills at least a part of said cavity, covering the active layer.

In the device just described, once the forming operation has been performed (i.e. once the device includes a conducting filament, created for the first time), the shunt resistance, electrically connected in parallel to the active layer, is thus electrically connected in parallel with the filament, formed between the first electrode and the second electrode. As explained in detail below, this enables to limit variations of the high electric resistance of the memory cell, from one resetting cycle to the other.

The particular structure of the device, where the active layer raises on the edges of the cavity, covering the resistive layer, may seem inadequate in terms of operation, at first. Indeed in this configuration, the conducting filament could be formed in the part of the active layer which raises on the edges of the cavity (that is in the part of the active layer which is parallel to the side face of the cavity, and which covers the resistive layer), instead of being formed in the part of the active layer which is parallel to the bottom of the cavity. And in this case, the values of the high and low resistances of the device are modified, compared to the expected operation. But, actually, the probability that the filament is formed in this part of the active layer, which is parallel to the side face (or side faces) of the cavity, is low, since "forming" preferentially occurs where the electric field is strongest.

Therefore, in terms of operation, this structure does not have any real drawback, compared to a structure in which the active layer would only cover the bottom of the cavity, for example. And in terms of manufacture, it turns out to be much more convenient to manufacture. Indeed, since the active layer rises at least in part on the edges of the cavity, this active layer can be made by a conformal depositing technique, by somehow lining the bottom and edges of the bowl formed by the cavity. This substantially simplifies manufacturing, compared to other kinds of technique. The structure of the device, with its different layers conformally deposited into the via formed by the cavity, is besides well adapted, as a whole, to manufacturing techniques used in microelectronics, and proves to be conducive to obtaining small dimension memory devices (typically occupying a surface area lower than a few square microns, for example lower than 3 square microns).

Moreover, since the first electrode fills at least part of the cavity, covering the active layer, it fills in the part of the cavity which is not occupied by the active layer. The thickness of the active layer can therefore be freely adjusted, independently of the thickness of the spacer layer.

By "conformal deposition", it is meant a deposition during which the deposited material covers the different portions of the surface on which it is deposited, even if these surfaces are oriented differently from each other. Particularly, the conformally deposited material covers both the horizontal portions and vertical portions of this surface (here, the material covers both the bottom, and the side face(s) of the cavity, for example). The conformally deposited layer thus grows in accordance with the topography of the surface on which it is deposited, by copying the shape of this surface.

By "active layer electrically interconnecting the first electrode to the second electrode", it is meant an active layer which directly interconnects the first electrode and the second electrode (i.e. direct contact of the active layer with the first and second electrode, that is without an intermediate element), or, alternatively, an active layer which indirectly interconnects the first electrode and the second electrode (i.e. through another electrically conducting zone).

The above-described device is to non-simultaneously have:
- a low resistive state, in which a conducting filament electrically interconnecting the first electrode to the second electrode uninterruptedly extends from end to end through the active layer, said filament having a low electric resistance, and
- a highly resistive state, in which said filament is broken, said filament having a high electric resistance.

Within the shunt resistance, for example formed of a slightly electrically conductive resistive material, no forming or breaking of a conducting filament occurs, during cycles of writing and resetting the memory. The shunt resistance is substantially constant. It does not dramatically vary during successive writing and resetting cycles.

Adding this essentially constant shunt resistance $R_{//}$ enables variations in the high resistance of the device $R_{TOT,H}$ to be limited, in spite of the variations in the high resistance of the filament $R_H$ from one resetting cycle of the memory to the other.

Figure 3:
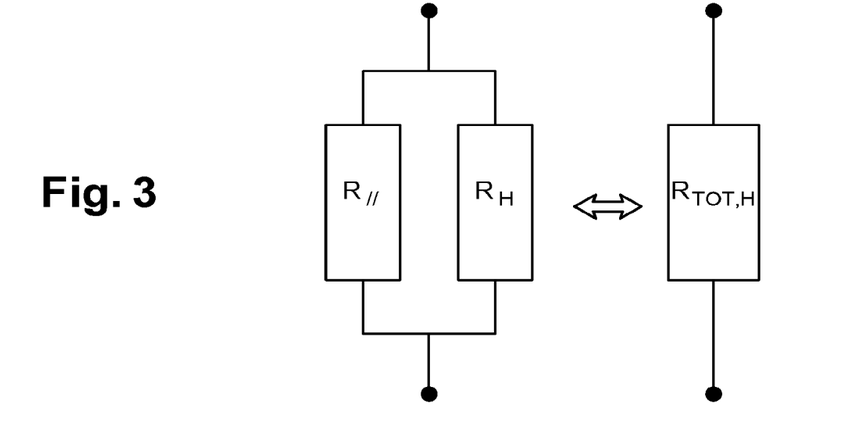
FIG. 3 represents an electric circuit equivalent to a filament type memory device, the device being in a highly resistive state.

Indeed, in its highly resistive state, the device can be represented by an equivalent electric circuit comprising the shunt resistance $R_{//}$, and, being connected in parallel, the high resistance of the filament, $R_H$ (see FIG. 3), the whole having a resistance $R_{TOT,H}$, given by the following formula F1:

$$R_{TOT,H} = \frac{1}{1/R_{//} + 1/R_H} \tag{F1}$$

And this formula shows that the relative variations in the high resistance of the device, $R_{TOT,H}$, are lower than the relative variations in the high resistance of the filament $R_H$, since the amount $1/R_{//}$, which is essentially constant is added to the (variable) amount $1/R_H$, which therefore decreases the relative variations of the whole.

This formula also shows that the relative variations in the high resistance of the device $R_{TOT,H}$ are all the lower that the shunt resistance $R_{//}$ is small. Indeed, the smaller the shunt resistance, the larger the term $1/R_{//}$, added to the term $1/R_H$ to mitigate variations thereof. In practice, it is therefore advisable to select a low shunt resistance, typically lower than or equal to the high resistance of the filament.

Reducing variations in the high resistance of the device $R_{TOT,H}$ (obtained whatever the value of $R_{//}$, but more or less strongly) can be well understood in the particular case where the shunt resistance $R_{//}$ is much lower than the high resistance of the filament $R_H$, for example three times lower than $R_H$. Indeed, in this case, the high resistance of the device $R_{TOT,H}$ is nearly equal to the shunt resistance $R_{//}$, and therefore actually remains constant from one resetting cycle of the memory to the other, even if the high resistance of the filament $R_H$ varies.

It will be noted that adding the shunt resistance, the beneficial effect of which has just been set forth, is somewhat in opposition to the operating principle of a filament type memory, since part of the electric current passing through the device will then be diverted towards this resistance, which is invariable whatever the datum (0 or 1) stored in the device. Formulated differently, because of this constant shunt resistance, the deviation $R_{TOT,H}$-$R_{TOT,L}$ between the high resistance of the device $R_{TOT,H}$ and its low resistance $R_{TOT,L}$ will be lower than without the shunt resistance, whereas it a priori seems desirable to keep the greatest possible deviation between these two resistances.

But, in a filament type memory device (unlike, for example, in a MRAM—Magnetic Random Access Memory-type magnetic non-volatile memory), the high resistance $R_H$ is often largely higher than the low resistance $R_L$, most often times higher, or even more. It is therefore possible to select the shunt resistance $R_{//}$ so that it is both much smaller than the high resistance of the filament $R_H$ (to strongly limit variations in the high resistance of the device $R_{TOT,H}$, from one resetting cycle to the other), and much higher than the low resistance of the filament $R_L$ (to keep a significant deviation between $R_{TOT,H}$ and $R_{TOT,L}$). Then, a device having a high resistance $R_{TOT,H}$ which will vary very little, from one resetting cycle to the other will be obtained, while keeping a substantial deviation between the high resistance $R_{TOT,H}$ and low resistance $R_{TOT,L}$.

The shunt resistance $R_{//}$ will further enable stability of the low resistive state of the device to be improved, especially when the device is exposed to high temperatures. In a conventional OxRam type device without a shunt resistance, when the device, placed in its low resistive state, is subjected to high temperatures, a gradual increase in the value of the low resistance of the filament $R_L$ is commonly observed, over time, and sometimes the filament even breaks, switching the device to its highly resistive state. Adding the shunt resistance will enable this drift in the value of the low resistance of the device to be reduced. Indeed, part of the electric current which passes through the device will be diverted towards the shunt resistance $R_{//}$, thus reducing local temperature rise caused by electric current passing in the small filament portion that joins the upper part and the lower part of the filament (portion 42, of a low cross-section—see FIG. 1). Thus, thermal stresses in this small filament portion will be reduced, which will improve its lifetime, in particular at high temperature, the shunt resistance enabling thermal stress on the memory device to be released.

In addition to the abovementioned characteristics, the above-described device can have one or more further characteristics among the following ones, considered individually or according to any technically possible combinations:
  the active layer comprises a conducting filament which electrically interconnects the first electrode to the second electrode, the device having:
    a low resistive state, in which the conducting filament uninterruptedly extends from end to end through the active layer, said filament having a low electric resistance, and
    a highly resistive state, in which said filament is broken, said filament having a high electric resistance,
    said shunt resistance is electrically connected in parallel to said filament, between the first electrode and the second electrode.
  the shunt resistance is lower than or equal to the high resistance of the filament.
  the shunt resistance is higher than or equal to the low resistance of the filament.
  the shunt resistance is lower than 100 kiloOhms.
  the shunt resistance is higher than 12.9 kiloOhms.
  a dielectric material layer is interposed between the active layer and said resistive material layer.
  the active layer, which extends from the first electrode to the second electrode, is laterally delimited by at least one side face, and the resistive material layer, which forms at least a part of the shunt resistance, extends from the first electrode to the second electrode, parallel to the side face of the active layer.
  the dielectric material layer is interposed between the side face of the active layer and said resistive material layer.
  said resistive material layer further extends on the bottom of the cavity, between the active layer and the bottom of the cavity.
  the device comprises an electrically insulating block which divides the cavity into at least one first sub-cavity and a second sub-cavity, and a third electrode, electrically insulated from the second electrode, and the second electrode fills the first sub-cavity whereas the third electrode fills the second sub-cavity.
  said resistive material has an electric conductivity between 0.1 ohm×centimetre and 10 ohms×centimetres.
  the active layer is formed of a metal oxide, particularly in the case of an OxRam, or of an electrolytic material, for example in the case of a CbRam.

It is also provided a method for manufacturing a filament type non-volatile memory device, comprising the following steps:
  depositing, on the first electrode, an electrically insulating, spacer layer,
  etching, in the spacer layer, a cavity having a bottom, consisting of a part of the first electrode which, after etching, is no longer covered with the spacer layer, the cavity having at least one side face which, in the spacer layer, laterally delimits the cavity,
  making a shunt resistance, at least partially formed of a resistive material layer deposited against the side face of the cavity,
  conformally depositing an active layer, which extends parallel to the bottom of the cavity and which further extends by covering said resistive material layer,
  making a second electrode which partially covers the spacer layer and fills at least a part of said cavity, covering the active layer, the active layer electrically interconnecting the first electrode to the second electrode, the shunt resistance being electrically connected in parallel to said active layer, between the first electrode and the second electrode, the device being suitable for having:
  a low resistive state, in which a conducting filament, electrically interconnecting the first electrode to the second electrode, uninterruptedly extends from end to end through the active layer, said filament having a low electric resistance, and
  a highly resistive state, in which said filament is broken, said filament having a high electric resistance.

This method can further comprise the following steps, performed after having made the shunt resistance, and before depositing the active layer:
  conformally depositing a dielectric material layer, said layer extending parallel to the bottom of the cavity and further extending parallel to the side face of the cavity, the dielectric material layer covering said resistive material layer,
  etching the dielectric material layer, so as to remove the part of this layer which extends parallel to the bottom of the cavity.

The above set forth non-volatile memory device and its different applications will be better understood upon reading the following description and examining the appended figures.

BRIEF DESCRIPTION OF THE FIGURES

The figures are set out by way of indicating and in no way limiting purposes.

DETAILED DESCRIPTION

As already mentioned, the present technology relates to a filament type non-volatile memory device, for example an OxRam type, or CB-RAM type device, in which fluctuations in the high resistance of the device $R_{TOT,H}$, from one resetting cycle to the other, are made particularly low by virtue of a shunt resistance $R_{//}$, electrically connected in parallel to the conducting filament present in the active layer of the device.

Different embodiments of this device, which respectively bear reference numerals 61; 71; 81; 91; 101, are schematically represented in FIGS. 5 to 9. Geometry and arrangement of some elements of the device vary, from one embodiment to the other, but these different embodiments have numerous common features. From one embodiment to the other, identical or corresponding elements will therefore be referred to using the same reference signs and will not necessarily be described each time.

In each of these embodiments, the device 61; 71; 81; 91; 101 comprises:
  a first electrode 62; 72,
  a second electrode 63; 73; 103, and
  an active layer 64; 74; 140, 140' which extends between the first electrode and the second electrode, the abovementioned conducting filament 641; 741; 141, 141' passing through this active layer to electrically interconnect the first electrode to the second electrode.

The active layer is electrically insulating, except at the filament in question.

The term layer can for example refer to a stretch of material delimited by two opposite surfaces parallel to each other, or substantially parallel to each other (that is parallel within 15 degrees).

As indicated above, the device 61; 71; 81; 91; 101 also comprises a shunt resistance $R_{//}$, electrically connected in parallel to the filament 641; 741; 141, 141', between the first electrode and the second electrode. In the embodiments represented in the figures, this shunt resistance is formed of one or more layers 65; 75; 95; 105, 105' of slightly electrically conductive, resistive material. The resistive material layer(s) each extend from the first electrode to the second electrode.

The first electrode 62; 72 and the second electrode 63; 73; 103 are electrically conducting. They are for example formed of one or more metal materials, such as Titanium Ti or platinum Pt. The electrodes can in particular comprise one or more metal layers.

In the case where the device is an OxRam type device, the active layer 64; 74; 140, 140' is more precisely formed of a metal oxide, for example tantalum or hafnium oxide. And in the case where the device is a CB-RAM type device, the active layer is formed of a solid electrolyte, in which metal cations can be relocated and reduced to form the conducting filament. The active layer can have a thickness e between 3 and 50 nanometres.

In addition to the abovementioned metal layer(s), the first electrode 62; 72 and/or the second electrode 63; 73; 103 can comprise, on the side of the active layer, one or more auxiliary layers (not represented in the figures) such as a reservoir layer likely to exchange oxygen vacancies with the active layer, or such as a protective layer preventing oxygen from migrating.

The device 61; 71; 81; 91; 101 has:
  a low resistive state, in which the conducting filament 641; 741; 141, 141' uninterruptedly extends from end to end through the active layer 64; 74; 140, 140', the filament having a low electric resistance $R_L$, and
  a highly resistive state, in which the filament 641; 741; 141, 141' is broken, the filament having a high electric resistance $R_H$.

As will be detailed in the following, the shunt resistance $R_{//}$ is selected higher than the low resistance of the filament $R_L$.

As explained in the part entitled "summary" and as illustrated by FIG. 3, in its highly resistive state, the total electric resistance of the device, $R_{TOT,H}$, is that of an equivalent electric circuit comprising the shunt resistance $R_{//}$, and, connected in parallel, the high resistance of the filament, $R_H$. The high resistance of the device $R_{TOT,H}$ is therefore equal to $1/(1/R_{//} + 1/R_H)$.

By virtue of the shunt resistance $R_{//}$, relative fluctuations in the high resistance of the device $R_{TOT,H}$, from one resetting cycle to the other for a same device, are therefore lower than relative fluctuations in the high resistance of the filament $R_H$ (more explanations about it will be given in the part setting out the "summary"). Thus limiting variations in the high resistance of the device $R_{TOT,H}$ makes data storage in the device more reliable, and makes stored data reading simpler to perform.

Variations in the high resistance of the device $R_{TOT,H}$, from one resetting cycle to the other, are all the more strongly reduced as the ratio $R_{//}/R_H$ is small. This is the reason why the shunt resistance $R_{//}$ is here selected lower than the high resistance of the filament $R_H$. Here, the shunt resistance $R_{//}$ is more precisely lower than the average of the high resistance of the filament $R_H$ (resistance of which it is reminded that it fluctuates from one resetting cycle to the other).

When the device is an OxRam type device, the device can for example be manufactured so that the shunt resistance $R_{//}$ is lower than 100 kiloOhms. In this type of device, the high resistance of the filament $R_H$ has an average value which is generally higher than or equal to 100 kiloOhms (ref. FIG. 2). Manufacturing the device so that the shunt resistance $R_{//}$ is lower than 100 kOhms therefore generally ensures that the shunt resistance is lower than the average of the high resistance of the filament $R_H$.

Figure 4:
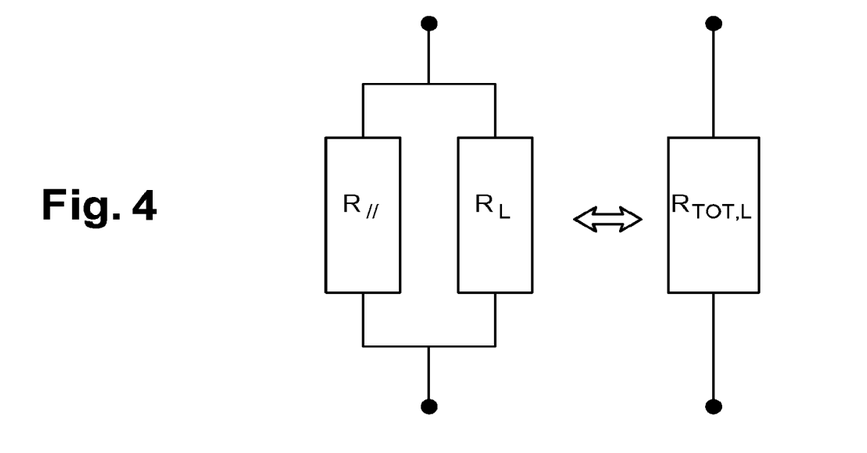
FIG. 4 represents an electric circuit equivalent to the same filament type memory device, the device being in a low resistive state, FIG. 5 schematically represents a first embodiment of the memory device in question, in a cross-section view, FIG. 6 schematically represents a second embodiment of the memory device, in a cross-section view, FIG. 7 schematically represents a third embodiment of the memory device, in a cross-section view, FIG. 8 schematically represents a fourth embodiment of the memory device, in a cross-section view, FIG. 9 schematically represents a fifth embodiment of the memory device, in a cross-section view.

In its low resistive state, the device 61; 71; 81; 91; 101 has a total electric resistance, $R_{TOT,L}$ which is that of an equivalent electric circuit comprising the shunt resistance $R_{//}$, and, being connected in parallel, the low resistance of the filament $R_L$ (see FIG. 4). The low resistance of the device, $R_{TOT,L}$, is therefore equal to $1/(1/R_{//} + 1/R_L)$.

The deviation $R_{TOT,H}$-$R_{TOT,L}$ between the high resistance of the device $R_{TOT,H}$ and its low resistance $R_{TOT,L}$ is all the lower as the shunt resistance $R_{//}$ is low.

This decrease in the deviation between $R_{TOT,H}$ and $R_{TOT,L}$, when the shunt resistance $R_{//}$ decreases, is well understood in the particular case for which the shunt resistance $R_{//}$ is both much smaller than the high resistance of the filament $R_H$, and much larger than the low resistance of the filament $R_L$. Indeed, in this case, the high resistance of the device, $R_{TOT,H}$, is nearly equal to the shunt resistance $R_{//}$, whereas the low resistance of the device, $R_{TOT,L}$ is nearly equal to the low resistance of the filament $R_L$. In this situation, it is well understood that decreasing the shunt resistance $R_{//}$, by making it approaching the low resistance of the filament $R_L$, makes the high resistance of the device $R_{TOT,H}$ closer to the low resistance of the device $R_{TOT,L}$.

A significant deviation between $R_{TOT,H}$ and $R_{TOT,L}$ facilitates the reading operation of the device, since the highly resistive and low resistive states of the device then correspond to resistance levels much different from each other.

So, to keep a significant deviation $R_{TOT,H}$-$R_{TOT,L}$, the shunt resistance $R_{//}$ is here selected higher than the low resistance of the filament $R_L$.

In practice, when the device is of the OxRAM type, the low resistance of the filament $R_L$ is about a few kiloOhms.

The low resistance of the filament $R_L$ obtained at the end of the manufacturing of the device, after the "forming" step, can vary quite significantly from one device to the other, even if the devices are initially identical.

But even if the value of the low resistance of the filament $R_L$, which will be obtained at the end of manufacturing, cannot be accurately predicted, it is known that it remains lower than 12.9 kiloOhms. This value is that of the resistance quantum Ro, equal to $h/(2e^2)$, h being Planck constant and e an electron charge. This resistance value corresponds, within a few variations, to the electric resistance of an elementary junction between two atoms of a conducting material, in contact with each other. When the conducting filament has been reformed (after a SET step), the resistance of the filament is therefore still lower than 12.9 kiloOhms (since at least one atom of the upper part of the filament then comes in contact with an atom of the lower part of the filament).

In the embodiments set forth here, the device 61; 71; 81; 91; 101 is manufactured so that the shunt resistance $R_{//}$ is higher than 12.9 kiloOhms. As explained above, this generally ensures that the shunt resistance $R_{//}$ is higher than the low resistance of the filament $R_L$ (in spite of the abovementioned variability of the value of $R_L$ from one device to the other).

As already indicated, the shunt resistance $R_{//}$ will also enable stability of the low resistive state of the device to be improved.

Indeed, part of the electric current which will pass through the device will then pass through the shunt resistance $R_{//}$, thus reducing the intensity of current which will pass through the filament, and therefore its temperature rise. In this regard, it will be noted that a bias voltage is generally applied to the memory device (when the memory is electrically powered), and that the total electric current which passes through the device then has a more or less fixed value (typically of a few hundred microAmperes). Since this total current has a substantially fixed value, adding the shunt resistance will therefore actually enable the electric current in transit through the filament to be reduced, by diverting a substantial part of the total electric current towards the shunt resistance $R_{//}$, thus reducing the temperature rise in question.

The geometric structure of the device 61; 71; 81; 91; 101 is now set forth in more detail, with reference to FIGS. 5 to 9.

In these embodiments, the active layer 64; 74; 140, 140' and the second electrode 63; 73; 103 are stacked on the first electrode 62; 72, which is planar. In a direction perpendicular to the main surface of the first electrode 62; 72, the active layer is delimited by the first and second electrodes; the active layer is interleaved, and even sandwiched between these two electrodes 67, 72, 63, 73. And laterally, the active layer 64; 74; 140, 140' is delimited by side faces 643, 643'; 743, 743'; 143, 143'. Stated differently, the extension of the active layer, in a plane parallel to the first electrode, is limited by these side faces. In the embodiments represented in the figures, these side faces 643, 643'; 743, 743'; 143, 143' extend in planes perpendicular to the first electrode 62; 72.

Figure 5:
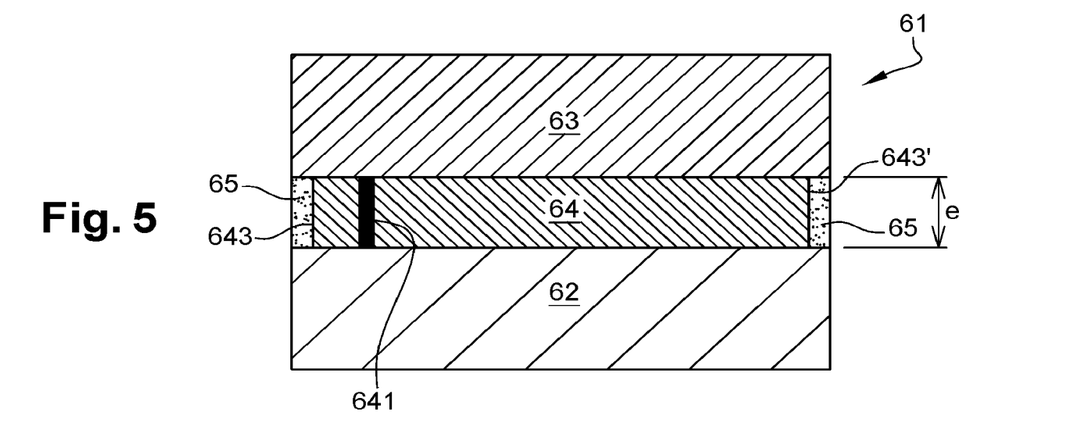

In the embodiment illustrated by FIG. 5, the second electrode 63 of the device 61 is planar, and is disposed parallel to the first electrode 62. The active layer 64, which extends between these two electrodes, is also planar and extends in a plane parallel to the first electrode 62. And the shunt resistance $R_{//}$ is formed of a same resistive material layer 65 which forms a one-piece coating extending throughout the perimeter of the active layer 64, by surrounding it laterally. The active layer 64 has for example a cylindrical shape and is surrounded by the resistive layer 65 forming the shunt resistance. The cross-section of the cylinder can be circular, square or rectangular for example.

In this case, the resistive material layer 65 is directly applied against the side faces 643, 643' of the active layer 64. It is here understood that in the case of a circular cross-section cylindrical structure such as described above, there is only one continuous wall forming the resistive material layer 65 and laterally coming against the active layer. Mentioning several side faces is therefore in no way limiting and above all aims at facilitating understanding of the cross-section view figures.

Alternatively, a layer of electrically insulating dielectric material, could however be interposed between the side faces 643, 643' of the active layer 64 and the layer 65 of resistive material, as is the case in the embodiments of FIGS. 6 to 8 described later.

Figure 6:
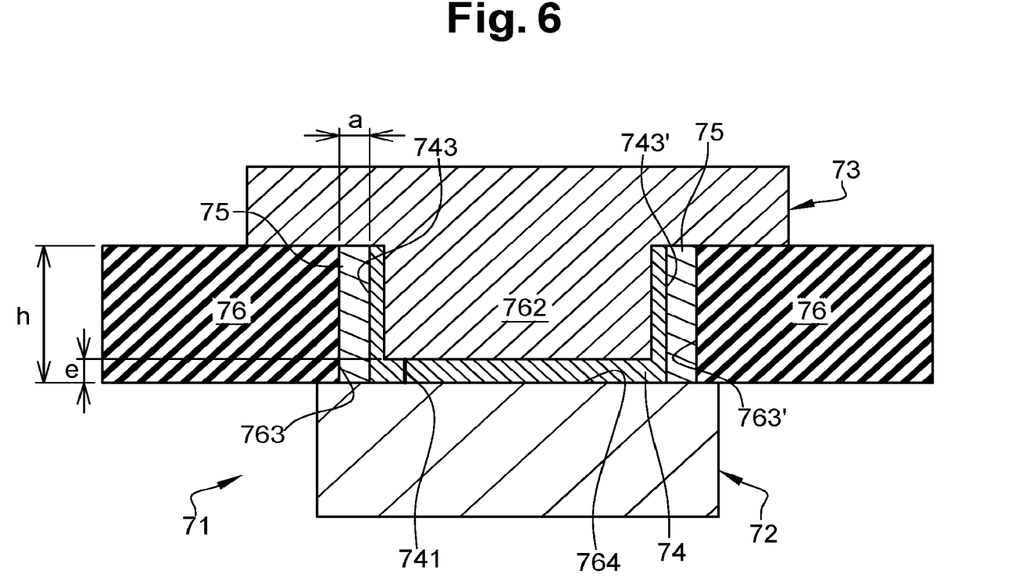
Figure 7:
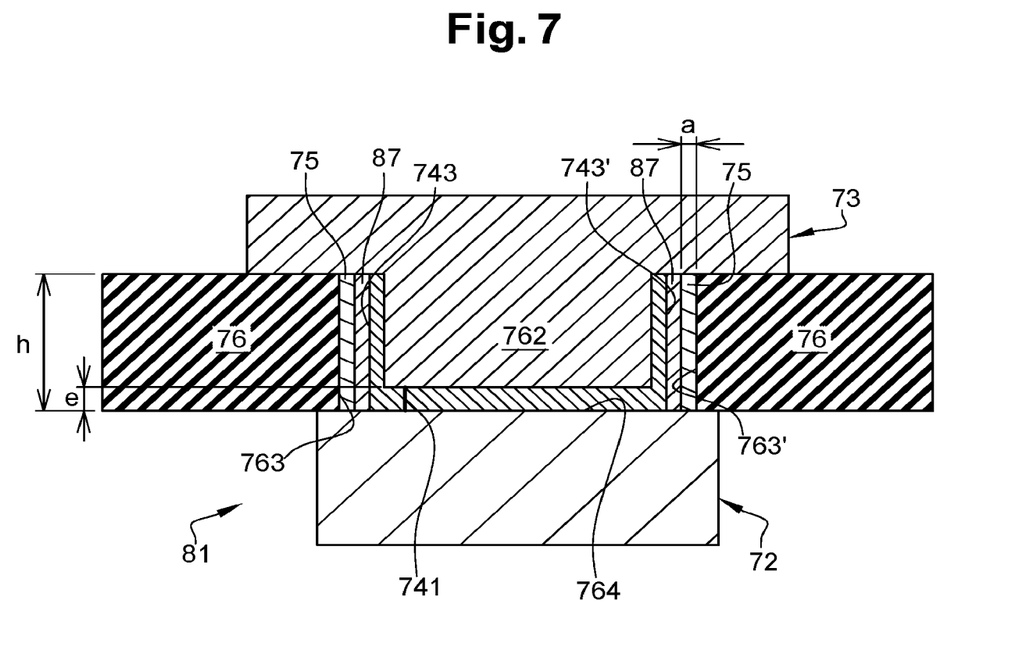
Figure 8:
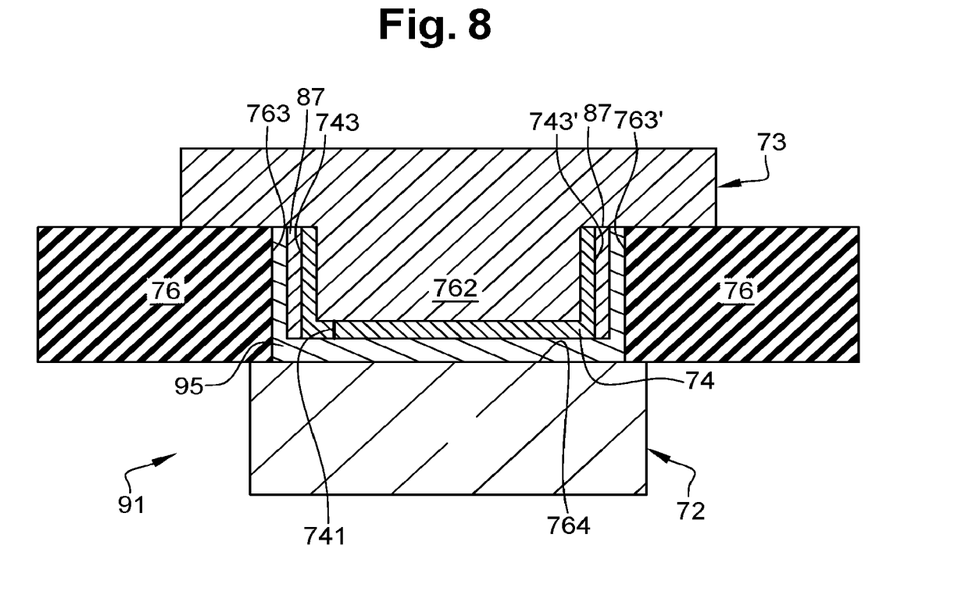

In the embodiments illustrated by FIGS. 6 to 8, the shunt resistance $R_{//}$ is also made as a resistive material layer 75; 95 forming a one-piece coating which extends throughout the periphery of the active layer 74 by surrounding it laterally (this type of coating is sometimes called "liner" in the field of microelectronics). This configuration is well adapted to manufacturing techniques used in micro-electronics, as well as that of FIG. 5.

In the case of FIG. 6, the layer 75 of resistive material is directly applied against the side faces 743, 743' of the active layer 74, in contact with the same.

And in the case of FIGS. 7 and 8, the resistive material layer 75; 95 is separated from these side faces 743, 743' by a dielectric material layer 87, that is of an electrically insulating material.

Just like the embodiment of FIG. 5, in the embodiments of FIGS. 7 and 8, the resistive material layer which forms the shunt resistance could be formed of a resistive material layer which only extends on some of the side faces of the active layer. The shunt resistance could also be formed by two resistive material layers disjoined from each other, and which extend on two different side faces of the active layer.

Figure 9:
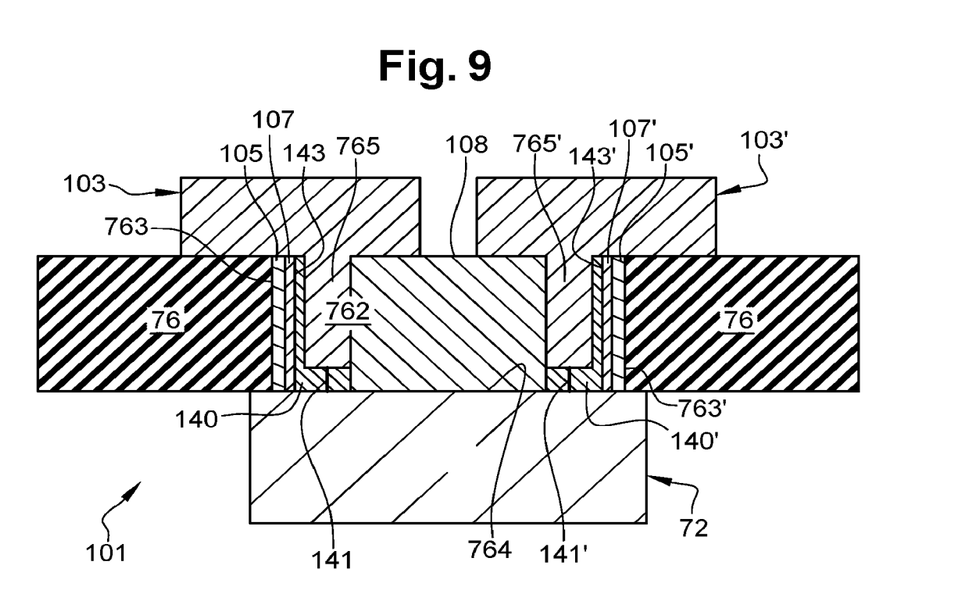

In the embodiment illustrated by FIG. 9, the device 101 comprises two memory cells, and therefore can store two binary data, independently of each other. It therefore comprises a first active layer 140 and a second active layer 140'. A conducting filament 141, 141', such as described above, is formed in each of these active layers 140, 140'. The device 101 also comprises a first shunt resistance and a second shunt resistance respectively formed by a first resistive material layer 105, and of a second resistive material layer 105'. The first resistive material layer 105 extends along a side face 143 of the first active layer 140, parallel to this side face. And the second resistive material layer 105' extends along a side face 143' of the second active layer 140', parallel to this side face.

In the embodiments represented in the figures, each layer 65; 75; 95; 105, 105' of resistive material extends perpendicular relative to the first electrode 62; 72.

In the embodiments of FIGS. 6 to 9, the device 71; 81; 91; 101 has a particular geometric structure, well adapted to manufacturing techniques used in micro-electronics, and conducive to obtaining small dimensions memory devices (typically occupying a surface area lower than a few square microns). This particular structure is set forth below.

In the embodiments of FIGS. 6 to 9, the second electrode 73; 103; 103' is separated of the first electrode 72 by an electrically insulating spacer layer 76. A cavity 762, which forms a kind of bowl, is provided in this spacer layer 76. The active layer 74; 140, 140' then extends along the walls of this cavity, at the bottom as well as on the edges of the cavity. The active layer 74; 140, 140' at least partly lines the walls of the cavities 762. As for the second electrode 73; 103, it partly covers the spacer layer and at least partly fills the cavity 762 in question to cover the active layer.

This configuration enables the active layer 74; 140, 140' to be easily made through conformal deposition, and with a large freedom regarding the thickness of this layer. The thickness of the active layer 74; 140, 140', and even the total thickness of all the layers comprising the active layer and possible abovementioned auxiliary layers (reservoir layer and protective layer, for example), can in particular have a much smaller thickness than the thickness h of the spacer layer, for example lower than half or the third of the thickness h.

Incidentally, the active layer 74; 140, 140', the resistive material layer (75; 95; 105, 105'), and/or the dielectric material layer can have a low thickness relative to the extension (dimensions) of the layer considered, parallel to this layer (small thickness of the layer relative to its surfacic extent).

The spacer layer 76 partly covers the first electrode 72. The bottom 764 of the cavity 762 consists of a part of the first electrode 72 which is not covered with the spacer layer 76. The cavity also has side faces 763, 763', which laterally delimit the cavity. Here, these side faces are perpendicular to the first electrode 72.

In the case of FIGS. 6 to 8, the resistive material layer 75; 95, which forms the shunt resistance $R_{//}$, is applied on all the side faces 763, 763' of the cavity (and thus forms a one-piece coating which covers the side face of the cavity throughout its periphery). As previously explained, the plurality of side faces 763, 763' is here given by way of example to illustrate the cross-section views, it being understood that the resistive material layer 75, 95 generally has a single face in the case of a substantially circular cross-section cylinder (or 4 faces in the case of a square or rectangular cross-section cylinder) which surrounds the active layer.

In the embodiments of FIGS. 6 and 7, the layer 75 of resistive material covers the side faces 763, 763' of the cavity, but not its bottom 764.

And in the embodiment illustrated by FIG. 8, the layer 95 of resistive material, applied to the side faces 763, 763' of the cavity, is continued to the bottom of the cavity 762 by covering the first electrode 72. The resistive material layer 95 then forms a one-piece coating which lines all the walls of the cavity 762, that is both the bottom 764 of the cavity and its side walls 763, 763'. At the bottom 764 of the cavity, the resistive material is directly in contact with the first electrode 72, and is covered with the active layer 74.

Regarding now the active layer 74, in the embodiments of FIGS. 6 to 8, it extends parallel to the bottom 764 of the cavity, on the whole surface of the bottom, and then is continued, perpendicular to the bottom of the cavity, by covering the resistive material layer 75; 95 (which is applied against the side walls 763, 763' of the cavity).

In the embodiments of FIGS. 6 to 8, the second electrode 73 partly covers the spacer layer 76, and fills the part of the cavity 762 left free by the abovementioned 74, 75; 95, and possibly 87 layers. In particular, the metal(s), which form at least part of the second electrode 76, fills in at least a part of this cavity.

In the embodiment illustrated by FIG. 6, the active layer 74 is directly applied against the bottom 764 of the cavity, in contact with the first electrode 72. And the part of the active layer 74 which extends perpendicular to the bottom of the cavity, and which covers the resistive material layer 75, is directly applied against the resistive material layer 75, in contact with it.

In the device 71 illustrated by FIG. 6, during the "forming" step, the filament 741 is formed between the first electrode 72 and the second electrode 73, generally in the part of the active layer 74 which extends parallel to the bottom of the cavity (part of the active layer 74 applied against the first electrode 72).

But, in this device 71, the filament can sometimes be formed (with a lower probability) between the second electrode 73 and the resistive material layer 75, in the part of the active layer 74 which extends transversally, perpendicular to the first electrode 72. The value of the shunt resistance, which is finally connected in parallel to the filament, is thereby modified, and furthermore, this adds a resistance in series with the filament, the value of which can be quite large. When the filament is formed this way, the values of the high and low resistances of the device can therefore be modified relative to what would be expected given the dimensions h and a of the resistive material layer 75. The operation of the device may therefore be no longer the optimum.

The probability that the filament is formed in the part of the active layer 74 which extends vertically, that is perpendicular to the first electrode 72, is however low. Nevertheless, it is interesting to avoid for sure forming the filament in this part of the active layer 74.

For this reason, it is provided, in the embodiments illustrated by FIGS. 7 and 8 (as well as in that illustrated by FIG. 9), interposing the dielectric material layer 87 between the resistive material layer 75; 95 on the one hand, and the part of the active layer 74 which extends vertically on the other hand. This is to ensure that the filament 741 is formed in the part of the active layer 74 which extends parallel to the bottom of the cavity 762. Moreover, the dielectric material layer 87 enables the resistive material layer 75; 95 to be protected, by avoiding putting it directly in contact with the active layer 74 (active layer which can for example contain oxygen). The layer 87 of dielectric material can for example be made of silicon nitride $Si_3N_4$, which makes up an efficient chemical (and electrical) barrier.

The device 81 of the embodiment of FIG. 7 is identical to the device 71 of FIG. 6, except that it comprises the abovementioned layer 87 of dielectric material.

The device 91 of the embodiment of FIG. 8 is identical to the device 81 of FIG. 7, except that the layer 95 of resistive material extends not only on the side walls 763, 763' of the cavity, but also on the bottom 764 of the cavity, as already indicated. At the bottom of the cavity, the layer 95 of resistive material is therefore interposed between the active layer 74 and the first electrode 72. From an electric point of view, this results in adding an additional electric resistance, in series with the resistance of the filament 71. This additional resistance is low (in the order of the kiloOhms or less), compared to the low resistance of the filament $R_L$, as well as compared to the shunt resistance $R_{//}$, and therefore does not modify the operation of the device. But it enables the "forming" step, which is like a kind of intentional breakdown of the active layer, to be less violent from an electric point of view. Thus, electric stress experienced by the active zone will be lessened, by virtue of this additional resistance. Besides, before the forming operation, the electric field is mainly located across the active zone, but after creating the filament, there is a large field across a brittle filament. Consequently, adding this additional resistance in series enables the electric field to be distributed on the filament and additional resistance in series. It will be noted incidentally that the active layer 741 electrically interconnects the first electrode 72 to the second electrode 73 indirectly, through this small additional resistance located between the active layer 74 and the first electrode 72. It will also be noted that this structure, with the layer 95 of resistive material that extends not only on the side wall(s), but also on the bottom of the cavity, further facilitates manufacturing the device, since it is not necessary in this case to etch the layer of resistive material, after conformally depositing the same (indeed, in this case, it is not necessary to remove the part of this layer which extends parallel to the bottom).

Regarding the device 101 of FIG. 9, it is similar to that of FIG. 7, but the cavity 762 is divided into a first sub-cavity 765, and a second sub-cavity 765' by an electrically insulating block 108, for example a filling oxide. This enables two memory cells to be made in the same cavity. Here, the electrically insulating block 108 is applied against the first electrode 72, and extends up to the top of the cavity 762.

In the first sub-cavity 765, the side face 763 of the cavity is covered with the first abovementioned layer 105 of resistive material (which forms the first shunt resistance of the device). Here, this layer extends only on this side face 763. A first dielectric material layer 107 covers the first resistive material layer 105. The first active layer 140 extends horizontally, on the bottom of the first sub-cavity 765, and, vertically, against the first dielectric material layer 107. The second electrode 103 partly covers the spacer layer 76, and fills the part of the first sub-cavity 765 left free by the abovementioned layers 105, 107 and 140, covering the first active layer 140. In particular, the metal(s), which form at least a part of the second electrode, fills in at least a part of the first sub-cavity. The ensemble of elements located between the first electrode 72 and the second electrode 103 forms the first memory cell of the device.

The structure of the device at the second sub-cavity 765' is similar to what has just been set forth for the first sub-cavity 765.

More precisely, in the second sub-cavity 765', the side face 763' of the cavity is covered with the second resistive material layer 105' (which forms the second shunt resistance of the device). Here, this layer only extends on this side face 763'. A second dielectric material layer 107' covers the second resistive material layer 105'. The second active layer 140' extends horizontally, on the bottom of the second sub-cavity 765', and, vertically, against the second dielectric material layer 107'. A third electrode 103', electrically insulated from the second electrode 103 (so that both memory cells can be addressed independently) partly covers the spacer layer 76 and fills the part of the second sub-cavity 765' left free by the abovementioned layers 105', 107' and 140', covering the second active layer 140'. The ensemble of elements located between the second electrode 72 and the third electrode 103' forms the second memory cell of the device 101.

Alternatively, the device of FIG. 10 could comprise more than two distinct memory cells.

In the different embodiments represented in FIGS. 6 to 9, the spacer layer 76 has a thickness h. The resistive material layer 75; 95, 105, 105' which forms the shunt resistance therefore has a length, in the direction followed by electric current, equal to the height h. The resistive material layer 75; 95, 105 beside has a thickness a, and a cross-sectional area a×b (inlet cross-sectional area into the layer, at the second electrode 73; 103).

The value of the shunt resistance $R_{//}$ is therefore given, as a good approximation, by the following formula F2:

$$R_{//} = \frac{\rho h}{a \times b} \quad (F2)$$

where ρ is the resistivity of the resistive material in question.

In practice, the height h of the spacer layer 76 can for example be between 30 and 100 nanometres, the thickness a of the active layer can be between 3 and 30 nanometres, and the "width" b of the layer (transverse extension of the layer) is typically 10 times larger than its thickness a. The amount h/(a×b) is then in the order of $10^8$ metres. To obtain the order of magnitude desired for the shunt resistance $R_{//}$, typically between 10 and 100 kiloOhms, a resistive material having a resistivity ρ in the order of 1 Ohm×centimetre is therefore well adapted.

More generally, a resistive material having a resistivity p between 0.1 Ohm×centimetre and 10 Ohm×centimetres enables a value well adapted for the shunt resistance $R_{//}$ to be obtained, for small size memory devices such as described above, made by techniques of thin film deposition.

The resistive material can be a semi-conductor material, which enables a device to be conveniently manufactured.

But the resistivity of a semiconductor material varies quite strongly with temperature. Thus, if the device is to be used in an environment subjected to strong temperature variations, for example in an engine compartment of automobile vehicle, the layer of resistive material will rather be made, for example, of metal carbide (carbon proportion being adjusted so as to obtain the desired resistivity value), which enables a resistivity value, and therefore a shunt resistance $R_{//}$, stable over an extended temperature range, to be obtained. The embodiments of the device 71; 81; 91; 101, respectively represented in FIGS. 6 to 9, can be each produced by means of a manufacturing method comprising, inter alia, the following steps, performed in this order:

S1: making the first electrode 72,
S2: depositing the spacer layer 76 onto the first electrode 72,
S3: making the cavity 762, by etching the spacer layer,
S4: conformally depositing the resistive material for forming the shunt resistance $R_{//}$, against the bottom 764 and the side face 763 (or side faces) of the cavity 762,
S6: conformally depositing the active layer 74; 140, 140', the active layer then extending parallel to the bottom 764, and continuing parallel to the side face of the cavity (or parallel to the side faces of the cavity) by covering the resistive material layer,
S7: making the second electrode 73; 103, 103', this step here comprising the following sub-steps:
S71: making a part of the second electrode 73; 103, this part filling the whole volume let free in the cavity 762, or in the first sub-cavity 105, and covering the active layer 74; 140, this part of the second electrode being made by depositing one or more electrically conducting materials,
S72: planarising the free upper surface of the device, for example by chemical mechanical polishing (CMP),
S73: depositing another part of the second electrode 73; 103, which covers the cavity 762 or the first sub-cavity 105, and which also covers a part of the spacer layer 76.

Optionally, step S4 can comprise an anisotropic etching sub-step for removing the horizontal part of the layer of resistive material (that is the part of this layer which extends parallel to the bottom 764 of the cavity). This etching is made before depositing the active layer. This sub-step is made when it is desired to manufacture a memory device such as 71 or 81 of FIG. 6 or of FIG. 7, in which the resistive material layer is not interposed between the active layer 74 and the first electrode 72.

The method can also comprise a step S5 of making the above-described dielectric material layer 87; 107, 107', this step being carried out after step S4, and before step S6. Step S5 comprises the following sub-steps:

conformally depositing the layer 87; 107, 107' of dielectric material, so that this layer extends parallel to the bottom 764 of the cavity (against the bottom, or against the horizontal part of the resistive layer) and continues parallel to the side face 763 (or side faces), by covering the resistive material layer 75; 95; 105, 105' and etching the layer 87; 107, 107' of dielectric material, through anisotropic etching, so as to remove the part of this layer which extends parallel to the bottom of the cavity 762.

Optional step S5 is carried out when it is desired to obtain a memory device such as 81; 91; 101 of FIGS. 7 to 9, for example.

In the embodiments of FIGS. 6 to 8, the active layer 74 is as a single piece and covers the bottom as well as the side face, or all of the side faces of the cavity 762. It can be made conveniently, through conformal deposition. Thus, upon manufacturing the device 71; 81; 91 in question, the manufacturing method does not include an intermediate step of modifying the tactive layer conformation, between step S6 and step S7.

The method which has just been described can include other steps, for example a "forming" step, in addition to those described above.

The invention claimed is:

1. A filament-type non-volatile memory device, comprising a first electrode, a second electrode and an active layer extending between the first electrode and the second electrode, the active layer electrically interconnecting the first electrode to the second electrode, the device being adapted to have:

a low resistive state, in which a conducting filament electrically interconnecting the first electrode to the second electrode uninterruptedly extends from end to end through the active layer, said filament having a low electric resistance, and a highly resistive state, in which said filament is broken, said filament having a high electric resistance, the device comprising a shunt resistance electrically connected in parallel to said active layer, between the first electrode and the second electrode, in which:

an electrically insulating spacer layer, partly covers the first electrode, a cavity being provided in this spacer layer, said cavity having a bottom, consisting of a part of the first electrode which is not covered with the spacer layer, the cavity having at least one side face which, in the spacer layer, laterally delimits the cavity, the shunt resistance is at least partially formed of a resistive material layer applied against the side face of the cavity, the active layer of the device extends parallel to the bottom of the cavity and further extends by covering said resistive material layer, wherein the second electrode partially covers the spacer layer and fills at least part of said cavity, covering the active layer, and wherein a layer of dielectric material is interleaved between the active layer and said resistive material layer.

2. A filament-type non-volatile memory device, comprising a first electrode, a second electrode and an active layer extending between the first electrode and the second electrode, the active layer electrically interconnecting the first electrode to the second electrode, the device being adapted to have:
- a low resistive state, in which a conducting filament electrically interconnecting the first electrode to the second electrode uninterruptedly extends from end to end through the active layer, said filament having a low electric resistance, and
- a highly resistive state, in which said filament is broken, said filament having a high electric resistance,
  the device comprising a shunt resistance electrically connected in parallel to said active layer, between the first electrode and the second electrode, in which:
  - an electrically insulating spacer layer, partly covers the first electrode, a cavity being provided in this spacer layer, said cavity having a bottom, consisting of a part of the first electrode which is not covered with the spacer layer, the cavity having at least one side face which, in the spacer layer, laterally delimits the cavity,
  - the shunt resistance is at least partially formed of a resistive material layer applied against the side face of the cavity,
  - the active layer of the device extends parallel to the bottom of the cavity and further extends by covering said resistive material layer,
  - wherein the second electrode partially covers the spacer layer and fills at least part of said cavity, covering the active layer, and
  - wherein said resistive material layer further extends on the bottom of the cavity, between the active layer and the bottom of the cavity.

3. A filament-type non-volatile memory device, comprising a first electrode, a second electrode and an active layer extending between the first electrode and the second electrode, the active layer electrically interconnecting the first electrode to the second electrode, the device being adapted to have:
- a low resistive state, in which a conducting filament electrically interconnecting the first electrode to the second electrode uninterruptedly extends from end to end through the active layer, said filament having a low electric resistance, and
- a highly resistive state, in which said filament is broken, said filament having a high electric resistance,
  the device comprising a shunt resistance electrically connected in parallel to said active layer, between the first electrode and the second electrode, in which:
  - an electrically insulating spacer layer, partly covers the first electrode, a cavity being provided in this spacer layer, said cavity having a bottom, consisting of a part of the first electrode which is not covered with the spacer layer, the cavity having at least one side face which, in the spacer layer, laterally delimits the cavity,
  - the shunt resistance is at least partially formed of a resistive material layer applied against the side face of the cavity,
  - the active layer of the device extends parallel to the bottom of the cavity and further extends by covering said resistive material layer,
  - wherein the second electrode partially covers the spacer layer and fills at least part of said cavity, covering the active layer, and
  - an electrically insulating block which divides the cavity into at least a first sub-cavity and a second sub-cavity, and
  - a third electrode, electrically insulated from the second electrode,
  - and wherein the second electrode fills the first sub-cavity whereas the third electrode fills the second sub-cavity.

4. The device according to claim 1, wherein the active layer comprises a conducting filament, which electrically interconnects the first electrode to the second electrode, the device having:
- a low resistive state, in which the conducting filament uninterruptedly extends from end to end through the active layer, said filament having a low electric resistance, and
- a highly resistive state, in which said filament is broken, said filament having a high electric resistance,
said shunt resistance being electrically connected in parallel to said filament, between the first electrode and the second electrode.

5. The device according to claim 1, wherein the shunt resistance is lower than or equal to the high resistance of the filament.

6. The device according to claim 4, wherein the shunt resistance is higher than or equal to the low resistance of the filament.

7. The device according to claim 1, wherein the shunt resistance is lower than 100 kiloOhms.

8. The device according to claim 1, wherein the shunt resistance is higher than 12.9 kiloOhms.

9. The device according to claim 1, wherein the active layer, which extends from the first electrode to the second electrode, is laterally delimited by at least one side face, and wherein the resistive material layer, which forms at least part of the shunt resistance, extends from the first electrode to the second electrode, in parallel to the side face of the active layer.

10. The device according to claim 9, wherein the dielectric material layer is interleaved between the side face of the active layer and said resistive material layer.

11. The device according to claim 7, wherein said resistive material has an electric conductivity between 0.1 ohm× centimetre and 10 ohms×centimetres.

12. The device according to claim 7, wherein the active layer is formed by a metal oxide.

13. The device according to claim 2, wherein the active layer comprises a conducting filament, which electrically interconnects the first electrode to the second electrode, the device having:
- a low resistive state, in which the conducting filament uninterruptedly extends from end to end through the active layer, said filament having a low electric resistance, and
- a highly resistive state, in which said filament is broken, said filament having a high electric resistance,
said shunt resistance being electrically connected in parallel to said filament, between the first electrode and the second electrode.

14. The device according to claim 13, wherein the shunt resistance is higher than or equal to the low resistance of the filament.

15. The device according to claim 2, wherein the shunt resistance is lower than or equal to the high resistance of the filament.

16. The device according to claim 2, wherein the shunt resistance is lower than 100 kiloOhms.

17. The device according to claim 2, wherein the shunt resistance is higher than 12.9 kiloOhms.

18. The device according to claim 2, wherein said resistive material has an electric conductivity between 0.1 ohm×centimetre and 10 ohms×centimetres.

19. The device according to claim 2, wherein the active layer is formed by a metal oxide.

\* \* \* \* \*